(12) United States Patent
Bikkina et al.

(10) Patent No.: US 12,283,968 B2
(45) Date of Patent: Apr. 22, 2025

(54) ANALOG-TO-INFORMATION CONVERSION USING ANALOG PRE-PROCESSING SENSING OF MULTI-BAND SIGNALS

(71) Applicant: Alphacore, Inc., Tempe, AZ (US)

(72) Inventors: Phaneendra Bikkina, Tempe, AZ (US); Esko Mikkola, Mesa, AZ (US)

(73) Assignee: Alphacore, Inc., Tempe, AZ (US)

( * ) Notice: Subject to any disclaimer, the term of this patent is extended or adjusted under 35 U.S.C. 154(b) by 218 days.

(21) Appl. No.: 18/203,597

(22) Filed: May 30, 2023

(65) Prior Publication Data

US 2023/0387935 A1 Nov. 30, 2023

Related U.S. Application Data

(60) Provisional application No. 63/346,757, filed on May 27, 2022.

(51) Int. Cl.
  *H03M 1/00* (2006.01)
  *H03M 1/12* (2006.01)
  *H03M 1/20* (2006.01)

(52) U.S. Cl.
  CPC ........... *H03M 1/20* (2013.01); *H03M 1/1205* (2013.01); *H03M 1/1245* (2013.01)

(58) Field of Classification Search
  CPC .... H03M 1/20; H03M 1/1205; H03M 1/1245; H03M 1/124; H03M 1/40
  USPC .................................. 341/144, 155, 141, 126
  See application file for complete search history.

(56) References Cited

U.S. PATENT DOCUMENTS

| | | | |
|---|---|---|---|
| 7,834,795 B1 | 11/2010 | Dudgeon et al. | |
| 8,977,223 B1* | 3/2015 | Gupta | H04B 1/109 |
| | | | 455/295 |
| 9,903,933 B2* | 2/2018 | Robinson | G01S 3/32 |
| 2003/0112966 A1* | 6/2003 | Halder | H04B 3/23 |
| | | | 379/406.05 |
| 2011/0205033 A1* | 8/2011 | Bandyopadhyay | G01S 5/0289 |
| | | | 340/10.51 |
| 2020/0028476 A1* | 1/2020 | Kim | H04B 1/0475 |

OTHER PUBLICATIONS

Abari, Omid et al. "Why analog-to-information converters suffer in high-bandwidth sparse signal applications." IEEE Transactions on Circuits and Systems I: Regular Papers 60.9 (2013), pp. 2273-2284.
Herley, Cormac et al. "Minimum rate sampling and reconstruction of signals with arbitrary frequency support." IEEE Transactions on Information Theory 45.5 (1999), pp. 1555-1564.

(Continued)

*Primary Examiner* — Peguy Jean Pierre

(57) ABSTRACT

Analog-to-information converter and method for performing analog-to-information conversion samples and down-converts N samples of an input multi-band signal using M analog sampling filters or samplers, where N is less than M. The N samples of the input multi-band signal are digitized to produce N digital samples of the input multi-band signal, which are multiplexed into M digital samples of the input multi-band signal. The M digital samples are up-converted and filtered at M digital reconstruction filters to produce a digital multi-band signal, which is processed at a processing unit to obtain information contained in the digital multi-band signal.

20 Claims, 9 Drawing Sheets

(56) References Cited

OTHER PUBLICATIONS

Dedic, Ian, "56Gs/s ADC Enabling 100GbE", https://inst.eecs.berkeley.edu/~cs294-59/fa10/resourcesOFC-2010-56Gss-ADC-Enabling-100GbE.pdf, (2010), 28 pgs.
Texas Instruments, "ADC12D1800 12-Bit, Single 3.6 GSPS Ultra High-Speed ADC", http://www.ti.com/lit/ds/symlink/adc12d1800.pdf, May 2010—Revised May 2017, 86 pgs.
Mishali, Moshe et al. "Xampling: Analog to digital at sub-Nyquist rates." IET circuits, devices & systems 5.1 (2011), pp. 8-20.
Aska, Jason et al. "Random sampling for analog-to-information conversion of wideband signals." 2006 IEEE Dallas/CAS Workshop on Design, Applications, Integration and Software. IEEE, (2006), 5 pgs.
Chen, Fred et al. "Design and analysis of a hardware-efficient compressed sensing architecture for data compression in wireless sensors." IEEE Journal of Solid-State Circuits 47.3 (2012), pp. 744-756.
Landau, H.J. "Necessary density conditions for sampling and interpolation of certain entire functions." Acta Mathematica 117.1 (1967), pp. 37-52.

\* cited by examiner

ANALOG-TO-INFORMATION CONVERSION USING ANALOG PRE-PROCESSING SENSING OF MULTI-BAND SIGNALS

BACKGROUND

Analog-to-information/feature converters, or AICs, are useful in various fields, including telecommunications, audio and video processing, data acquisition systems, and other applications where analog multi-band signals need to be digitized for processing, storage, or transmission. AICs operate to convert analog multi-band signals into discrete digital representations, which contain sufficient data to extract desired information or features contained in the analog multi-band signals.

Two of the most recent advanced approaches reported for direct analog-to-information conversion are blind multi-band sampling (BMS) and periodic non-uniform sampling (PNS). Both of these systems significantly reduce the number of samples required to reconstruct the input signal. The BMS approach mainly involves mixing/modulating the input signal with multiple periodic signals of different periodic functions, and down converting the signal to a baseband. In contrast, the PNS approach involves asynchronously sampling and filtering the input signal in such a way that the samples that contain information of unused spectrum are discarded. This effectively means that the net sample rate is twice the total used spectrum.

However, the hardware implementation of these direct analog-to-information conversion approaches has not yet been evaluated for radio frequency (RF) bandwidths due to the impact of circuit impairment on performance limitations. Although the AIC architectures facilitate slower analog-to-digital converters (ADCs), the signal encoding, typically performed by a mixer-type circuit, still occurs at the Nyquist frequency of the input to avoid aliasing. The jitter and aperture of this mixing stage limits the achievable analog-to-information conversion resolution.

Thus, there is a need for direct analog-to-information conversion that does not require high sampling rates for analog-to-digital conversion and provides lower jitter at Nyquist frequencies, as well as other benefits, such as enabling AICs with reduced size, weight, power and/or cost.

SUMMARY

Analog-to-information converter and method for performing analog-to-information conversion samples and down-converts N samples of an input multi-band signal using M analog sampling filters or samplers, where N is less than M. The N samples of the input multi-band signal are digitized to produce N digital samples of the input multi-band signal, which are multiplexed into M digital samples of the input multi-band signal. The M digital samples are up-converted and filtered at M digital reconstruction filters to produce a digital multi-band signal, which is processed at a processing unit to obtain information contained in the digital multi-band signal.

A method for performing analog-to-information conversion for multi-band signals in accordance with an embodiment of the invention includes receiving an input multi-band signal at M analog sampling filters, sampling and down-converting N samples of the input multi-band signal at selected N analog sampling filters of the M analog sampling filters, where N is less than M, digitizing the N samples of the input multi-band signal to produce N digital samples of the input multi-band signal, multiplexing the N digital samples of the input multi-band signal into M digital samples of the input multi-band signal, up-converting and filtering the M digital samples of the input multi-band signal at M digital reconstruction filters to produce a digital multi-band signal, and processing the digital multi-band signal at a processing unit to obtain information contained in the digital multi-band signal.

An analog-to-information converter for multi-band signals in accordance with an embodiment of the invention includes M analog sampling filters connected to an input terminal to receive an input multi-band signal, the M analog sampling filters being controlled to sample and down-convert N samples of the input multi-band signal at selected N analog sampling filters of the M analog sampling filters, where N is less than M, a plurality of analog-to-digital converters connected to the M analog sampling filters to digitize the N samples of the input multi-band signal to produce N digital samples of the input multi-band signal, a digital N:M multiplexer connected to the analog-to-digital converters to multiplex the N digital samples of the input multi-band signal into M digital samples of the input multi-band signal, M digital reconstruction filters connected to the digital N:M multiplexer to up-convert and filter the M digital samples of the input multi-band signal to produce a digital multi-band signal, and a processing unit coupled to the M digital reconstruction filters to process the digital multi-band signal to obtain information contained in the digital multi-band signal.

An analog-to-information converter for multi-band signals in accordance with another embodiment of the invention includes M samplers connected to an input terminal to receive an input multi-band signal, the M samplers being controlled to sample and down-convert N samples of the input multi-band signal, where N is less than M. a plurality of analog-to-digital converters connected to the M samplers to digitize the N samples of the input multi-band signal to produce N digital samples of the input multi-band signal, a digital N:M multiplexer connected to the analog-to-digital converters to multiplex the N digital samples of the input multi-band signal into M digital samples of the input multi-band signal, and a processing unit connected to the digital N:M multiplexer, the processing unit configured to up-convert and filter the M digital samples of the input multi-band signal to produce a digital multi-band signal and to process the digital multi-band signal to obtain information contained in the digital multi-band signal.

These and other aspects in accordance with embodiments will become apparent from the following detailed description, taken in conjunction with the accompanying drawings, illustrated by way of example of the principles of the embodiments.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended Figs. could be arranged and designed in a wide variety of different configurations. Thus, the following more detailed description of various embodiments, as represented in the Figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the embodiments is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
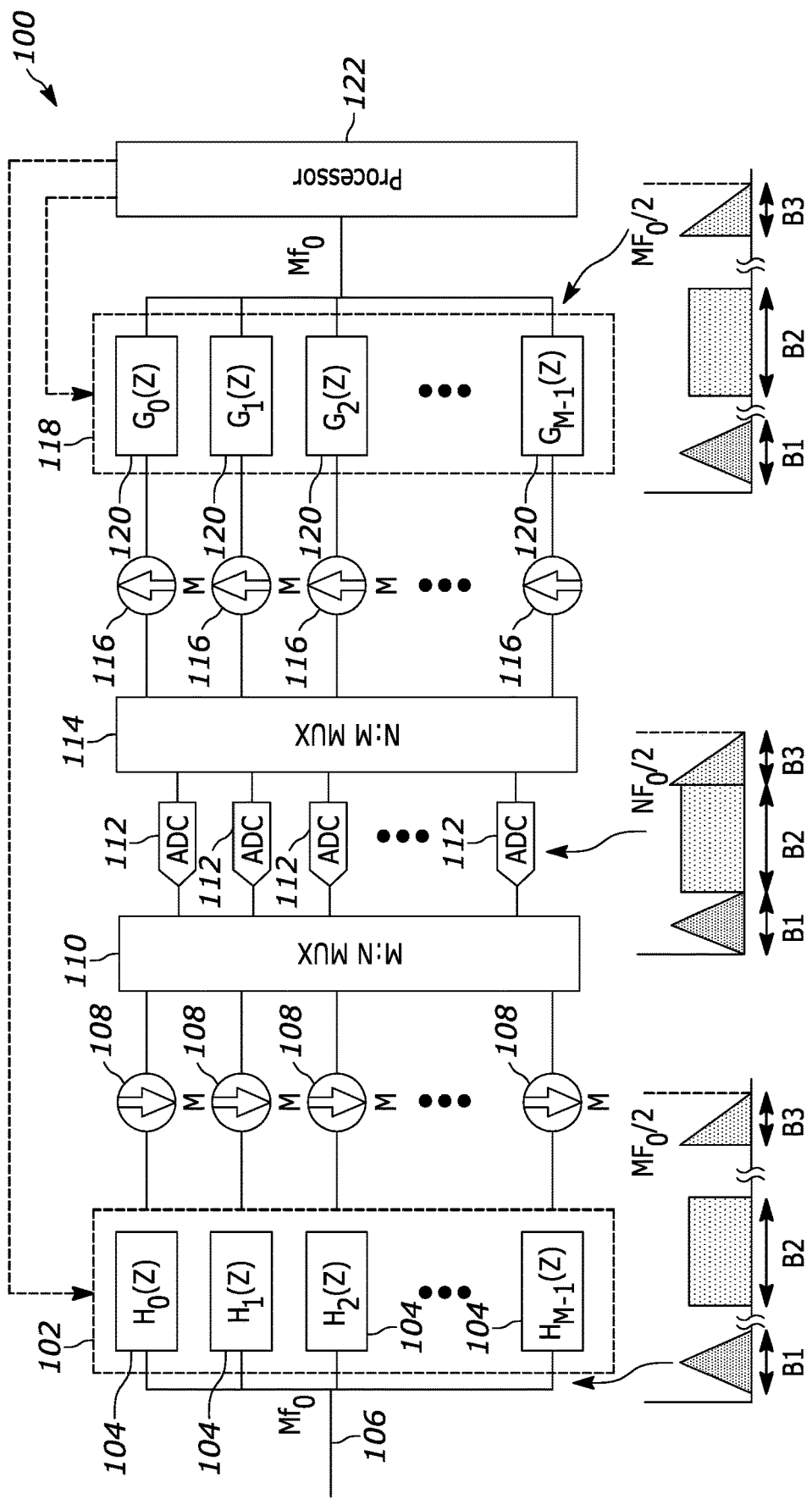
FIG. 1 is a diagram of an analog-to-feature/direct-information converter (AIC) architecture in accordance with an embodiment of the invention.

Turning now to FIG. 1, an analog-to-feature/direct-information converter (AIC) architecture 100 in accordance with an embodiment of the invention is shown. As described in detail below, the AIC architecture 100 is based on a minimum rate sampling and reconstruction (MRSR) algorithm of a periodic non-uniform sampling (PNS) method that uses pre-processing compression in the analog domain so that fewer samples are digitized and used for reconstructing input analog multi-band signals. Thus, the AIC architecture 100 does not require analog-to-digital converters (ADCs) with high sampling rates, which translates into significant power savings. In addition, the computational load for a processor for signal reconstruction will also be reduced.

As shown in FIG. 1, the AIC architecture uses a set 102 of M sampling filters 104 (where M is a positive integer), which are connected to an input terminal 106 that receives an analog input multi-band signal. Each sampling filter is designed to handle a sample of the analog input multi-band signal for a particular channel of a frequency spectrum. Each of the M sampling filters 104 is coupled to an analog down-converter 108, which down-converts the sample of the analog input multi-band signal for a particular channel. However, the M sampling filters 104 are used to capture only N samples of the analog input multi-band signal, which effectively compresses the samples required for reconstruction, as explained below. The down-converters 108 are connected to an analog M:N multiplexer 110, which transmits the N samples of the analog input multi-band signal to analog-to-digital converters (ADCs) 112. The outputs of the ADCs 112 are transmitted to a digital M:N multiplexer 114, which are connected to M digital up-converters 116 that are coupled to a set 118 of M reconstruction filters 120 that produces a digital multi-band signal, which is a digitized version of the input analog multi-band signal. The digital multi-band signal is transmitted to a processor 122, which is enabled to perform digital reconstruction of the input signal using the MRSR algorithm (described below). In addition, the processor 122 controls the filter coefficients of the sampling filters 104 and the reconstruction filters. In particular, the processor 122 controls the sampling filters 104 to disregard samples for frequency channels that are part of any signal bands of the input multi-band signals. In an embodiment, the processor 122 uses short time Fourier transform (STFT), a Cohen class transform, to determine these unwanted frequency channels.

In some embodiments, the outputs of the ADCs may also be transmitted to a different destination for other uses, such as analysis of the samples being selected.

The AIC architecture 100 uses analog-to-feature conversion that is performed mainly through "compressed sensing", which consists of analog pre-processing before digitization that requires fewer samples than required by the Nyquist-Shannon theorem (which requires the sampling rate $fs >= 2 \times f_{INMAX}$, where $f_{INMAX}$ is the highest frequency component of the input signal band). The reduced amount of samples should still meet the Nyquist-Landau rate criteria for complete reconstruction of the original signal. In order to understand the Nyquist-Landau rate, consider an example where the signal is formed with two sinusoidal frequency bands of 0-5 MHz (B1, Beff=5 MHz) and 100-105 MHz (B2, B2eff=5 MHz). In order to have a signal reconstruction, Nyquist-Shannon states that one needs at least two samples of the input signal frequency. So a general design approach would be to consider the highest frequency signal (in this case, 105 Mhz) and set the sampling frequency to at least twice (210 MHz) this highest frequency signal. However, in reality, the B1 band is also oversampled, in this case by more than twenty (20) times (210 MHz/10 MHz). The unnecessarily high oversampling rate increases the output data rate and also the size, weight and power (SWAP) requirements of the system. All the information of spectrum between these two bands (5 MHz-100 MHz) is also rendered useless. The key idea in the AIC is to bring all the bands closer (ideally, 100 MHz-105 MHz shifted to 5 MHz-10 MHz), without any overlapping (without any loss of spectral information), and to minimize the number of samples ($f_{S-new} << f_{S-Nyquist}$ and $f_{S-new} >= 2(B1eff+B2eff)$) to reconstruct the input signal.

Figure 2:
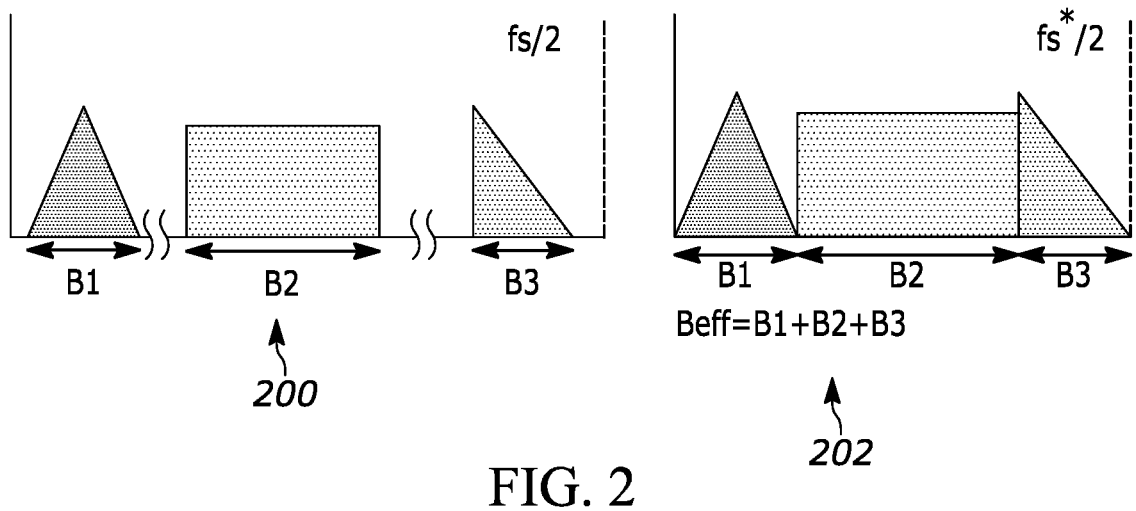
FIG. 2 illustrates an input multi-band signal with signal bands B1, B2 and B3 that is compressed using periodic non-uniform sampling (PNS), which is used as a basis for the AIC architecture shown in FIG. 1.

The AIC architecture 100 uses a PNS approach to reduce the number of samples required to reconstruct an input signal, where the input signal is asynchronously sampled and filtered in such a way that the samples that contain information of unused spectrum are discarded. This effectively means that the net sample rate is twice the total used spectrum, which is illustrated in FIG. 2. In this illustrated example, as shown in FIG. 2, the input multi-band signal 200 includes signal bands B1, B2 and B3 with some spacing in between the signal bands. The samples in the spacing or unused spectrum are then discarded to produce an output signal 202, as shown in FIG. 2. This approach compresses the signal frequency bands after the signals have been sampled while not losing any signal information.

Figure 3:
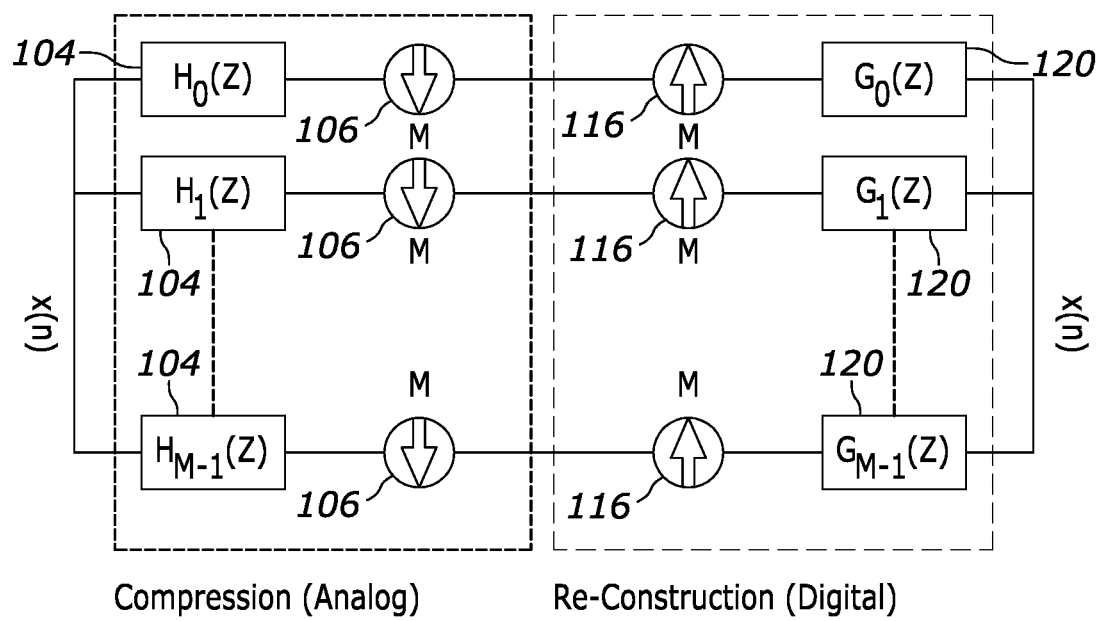
FIG. 3 shows a simplified representation of sampling filters, down-converters, up-converters and reconstruction filters of the AIC architecture shown in FIG. 1.

However, in the AIC architecture 100, rather than discarding the sampled signals in the unused spectrum, a compressed sensing is performed in the analog domain prior to digitization for reconstruction so that fewer signals need to be sampled and processed in the first place. Thus, for the input signal 202 including signal bands B1, B2 and B3 shown in FIG. 2, the samples that are initially captured in the analog domain for digitization are similar to the output signal 202 shown in FIG. 2. The compression and reconstruction technique used in the AIC architecture 100 will be described using a simplified representation of the sampling filters 104, the down-converters 108, the up-converters 116 and the reconstruction filters 120, which is illustrated in FIG. 3. To explain this technique of compression and reconstruction, consider an input similar to FIG. 2 with three signal bands B1, B2 and B3. The highest signal frequency is at the edge of B3 with a value of fs/2 (which can also be represented as $f_{max(B1,B2,B3)}$). This means the total sampling rate according to Nyquist-Shannon theorem should be fs (or $2f_{max(B1,B2,B3)}$).

Now let's assume that the input signal have been sampled to x(n) as shown in FIG. 3. Consider that $MF_0$ samples of x(n) are used to reconstruct the original signal using the up-converters 116 and the reconstruction filters 120 ($MF_0 >= fs$, or $2f_{max(B1,B2,B3)}$, for a typical Nyquist rate sampling and reconstruction). The choice of M and $F_0$ is based on number of parallel channels (M) used in the compression and reconstruction algorithm. Now the key idea is to identify if fewer samples can be used to reconstruct the same signal, with additional known information and hence reduce the payload samples (samples sent for digitization). These $MF_0$ samples sent to M channels of filters (H(z)) 104+down-converters 108 (↓M, the letter M denoting that the frequency is down-converted by the factor M), each operating at a frequency $F_0$. The reconstruction end of the algorithm will have up-converters 116 (↓M) and the reconstruction filters G(z) 120. The combination of compression and reconstruction filters (H(z) and G(z)) form bandpass filters with the down-converters 108 bringing the signal to baseband. By tuning/designing the filter coefficients, the data that has no spectral information/energy (which are not needed to reconstruct the original spectrum) can be discarded. This basically converts the $MF_0$ incoming samples entering the system to $NF_0$ samples for digitization, where N<M. In other words, the actual sampling rate is now $NF_0$, and hence, the signal band has been "compressed". This filtered and down-converted data is then digitized with the ADCs 112, which can be low-power, low-sample-rate ADCs, and sent as output to the processor 122 for reconstruction. In an embodiment, this processor 122 may be an on-chip digital signal processor (DSP) or an off-chip processor, such as a field-programmable gate array (FPGA). The reconstruction includes the up-converters 116 (by ↓M factor) and the reconstruction filters G(z) 120. In an embodiment, the sampling and reconstruction filters 104 and 120 are filters that use delay blocks as filter response.

In an embodiment, the design of the compression and reconstruction filters (H(z) and G(z)) 104 and 120 is based on a minimum rate sampling and reconstruction algorithm (MRSR) that does not need frequency mixing, as described in "Minimum rate sampling and reconstruction of signals with arbitrary frequency support" by Herley, Cormac, and Ping Wah Wong (hereinafter "Herley"), which is incorporated herein by reference. The algorithm has input data x(n) channelized into m-channel filter bank H(z) with channel $H_{m-1}(z)$ receiving an input data x(m-1) to start the compression phase. The input data x(n) is then subjected to processing with filter coefficients H(z) and then down-converted by m times. This step completes the compression phase. During the signal reconstruction phase, the signal is up-converted by again m times. The up-converted signal is then processed with G(z), which is typically inverse of H(z), with channel $G_{m-1}(z)$ processing the compressed x(m-1). The outputs of the G(z) filters are combined to form y(n), which is a reconstructed input data x(n) completing the reconstruction phase. Each of these channels collect sample at different time instants of the input at a rate of f0 (which is M times slower than the required sampling speed Mf0).

In an embodiment, the sampling and reconstruction filters 104 and 120 in the AIC architecture 100 may be similar to the filters described in Herley. Thus, the sampling filters H(z) may be defined as:

$$H_i(z) = \begin{cases} z^{-i}, & i \in 0 \\ z^{-i} - \sum_{k \in A} a_{ik}(z^M) z^{-k}, & i \notin A \end{cases}$$

where A is a set that contains only N of the indices {0, 1, ... M−1}. The reconstruction filters G(z) may be defined as:

$$G_i(z) = \begin{cases} z^i + \sum_{k \notin A} a_{ik}(z^M) z^k, & i \in A \\ z^i, & i \notin A \end{cases}$$

As noted above, the H(z) and G(z) filters may be filters that use delay blocks as filter response. Thus, the H(z) filters may be implemented with delay blocks and the G(z) filters may be implemented with synchronous blocks. The compression and reconstruction technique used in the AIC architecture 100 is further described with reference to such filters.

Figure 4A:
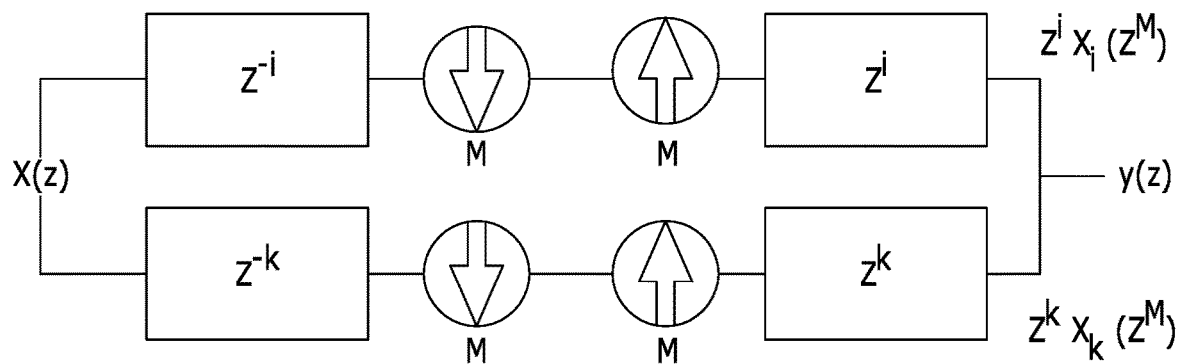
FIG. 4A shows any two arbitrary channel outputs, i and k, for an AIC based on the architecture shown in FIG. 1.

FIG. 4A shows any two arbitrary channel outputs, i and k, for an AIC based on the architecture 100 shown in FIG. 1. Note that $z^{-1}$ is a delay block that typically delays the sample by one clock cycle. Since $f_0$ is the frequency of the channel in this case, the clock cycle period is $1/f_0$ seconds. Similarly, $z^i$ is a synchronous block that removes the delay and synchronizes the samples. The summation output of the two channels i and k after reconstruction is $$y(z)=z^i X_i(z^M)+z^k X_k(z^M) \quad (1)$$

Now consider that channel i's filter is altered at the sampling level and channel k's filter at the reconstruction level. The new filter at the sampling level will be changed from $z^{-i}$ to $z^{-i}-z^{-k}\varphi(z^M)$, and at the reconstruction level from $z^k$ to $z^k+z^i\varphi(z^M)$, where $-z^{-k}\varphi(z^M)$ and $z^i\varphi(z^M)$ are altering values or signals. See Herley for more information for expression of signal processing with combination of down-conversion/up-conversion with delay/synchronization filters.

Notice that the output (y(z)) of the new signal reconstruction (FIG. 4B) is the same expression as (1) due to the cancellation of the $z^i\varphi(z^M)X_k(z^M)$ variable. This allows the AIC based on the architecture 100 to perform signal pre-processing at the input (which alters the input signal value) and still obtain the correct value after reconstruction by adopting reconstruction filters at the reconstruction end. The key idea here is that each of these altered filters only pass information of spectral energy of a particular band of the total spectrum. This means the channels that contain the information of the spectrum that is not part of the signal band (e.g., B1, B2, B3 in the example shown in FIG. 2) can be discarded at the sampling level. When these samples are discarded from these channels, it results in only $N*F_0$ samples (reduced from original $M*F_0$ samples) that actually have spectral information. The new sampling rate $N*F_0$ for signal reconstruction, reduced from $M*F_0$, should be ideally=$2*Beff$, where $Beff=(B1+B2+B3)$ which is $<<f_{max(B1,B2,B3)}$. Note that original sampling rate, $M*F_0$, for Nyquist-Shannon reconstruction was $>=2*f_{max(B1,B2,B3)}$. The new sampling rate $N*f_0$ is $<<M*f_0$, and hence, the backend ADCs 112 can digitize these samples at very low speeds and low power dissipation levels.

Figure 5:
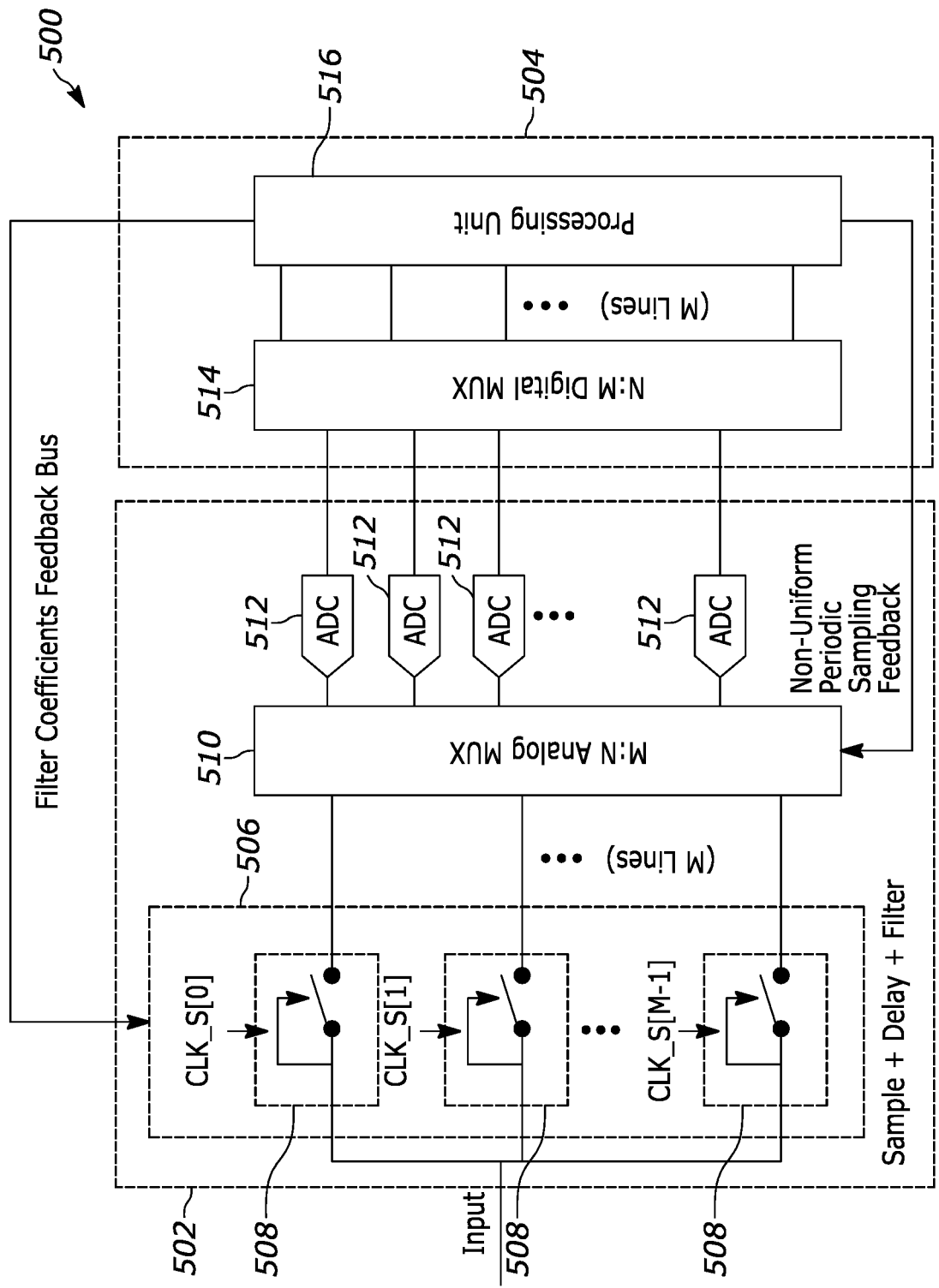
FIG. 5 is a block diagram of an AIC in accordance with a particular implementation of the invention.

Turning now to FIG. 5, an AIC 500 in accordance with a particular implementation of the invention. The architecture of the AIC 500 is separated into two domains. Thus, the AIC 500 includes a frontend analog section 502 for pre-processing that uses non-linear sampling filters in the analog domain. The AIC 500 also includes a backend digital reconstruction section 504 that uses the MRSR algorithm and short time Fourier transform (STFT), a Cohen class transform, for reconstruction and filter configuration. As described below, a feedback from the digital section 504 to the analog section 502, based on the MRSR algorithm, will help the analog filters efficiently converge to a solution such that the net sampling rate will reach close to twice the effective bandwidth. This means that when the input is a multiband signal ($B_1, B_2, \ldots B_N$), where the maximum frequency component is $f_{max(B1, B2, \ldots BN)}$ and effective non-overlapped bandwidth is $B_1+B_2+\ldots B_N$ ($B_{eff,N}$, $f_{max(B1, B2, \ldots BN)}>>B_{eff,N}$), the solution will ideally converge to $2*B_{eff,N}$ sampling rate (note that $2*B_{eff,N}<<2*f_{max(B1, B2, \ldots BN)}$). These low rate samples can be digitized by low-speed, low-power ADCs (e.g., 200 MSPS, 20 mW) covering all the signals of interest within the original much wider bandwidth (e.g., 10 GHz).

Figure 6:
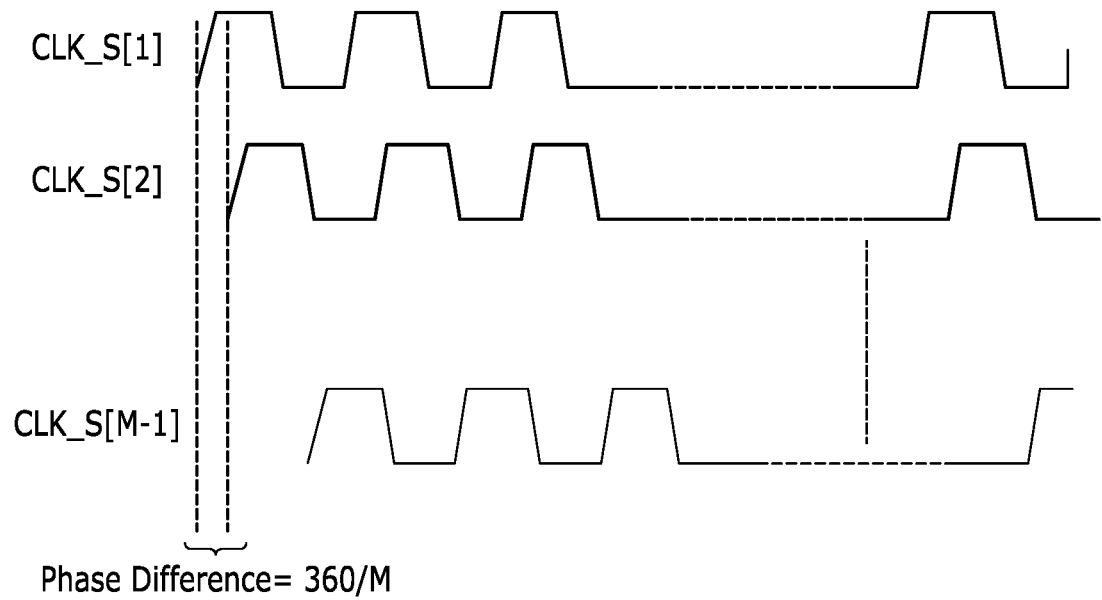
FIG. 6 shows an input signal as a train of n samples and time-interleaved sampling clock signals (CLK_S[k]) used in the AIC shown in FIG. 5.
Figure 6:
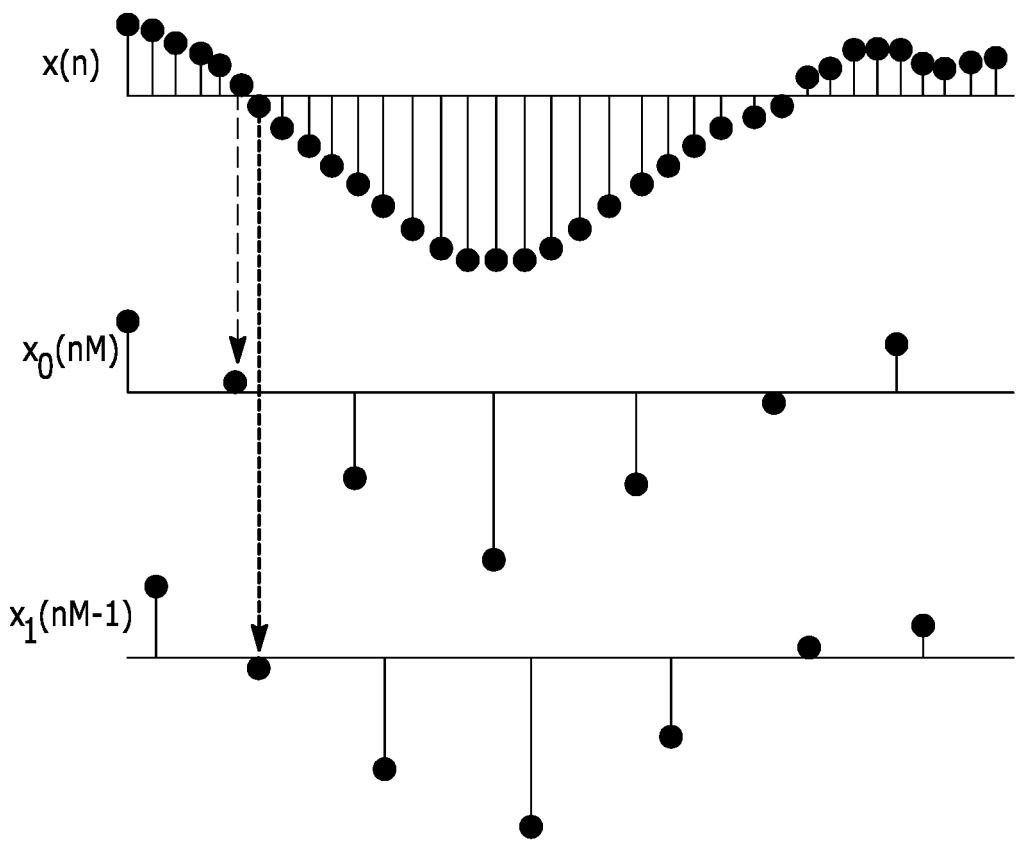

As shown in FIG. 5, the AIC includes a parallel network 506 of input samplers 508 that perform all filter delays, coefficient multiplication and down conversion functions needed for the compressed sensing or sampling of the MRSR algorithm. Thus, the input samplers 508 perform the functions of the sampling filters 104 and the down-converters 108 of the AIC architecture 100 shown in FIG. 1. Note that in the actual algorithm, for an input X(z), the output of $i^{th}$ channel of the compression part needs to be $Xi(nM)*z^{-i}$. This basically means that, if the input signal was a train of n samples, x(n), as shown in FIG. 6, only every $i^{th}$ sample (x(nM-i)) is selected by $i^{th}$ channel of the compression algorithm. In order to achieve this functionality, time-interleaved sampling clock signals (CLK_S[k]) are used in the AIC, which are shown in FIG. 6. The sampling clock signal rate is a factor M lower than the input signal rate, constituting a down-conversion.

Figure 4B:
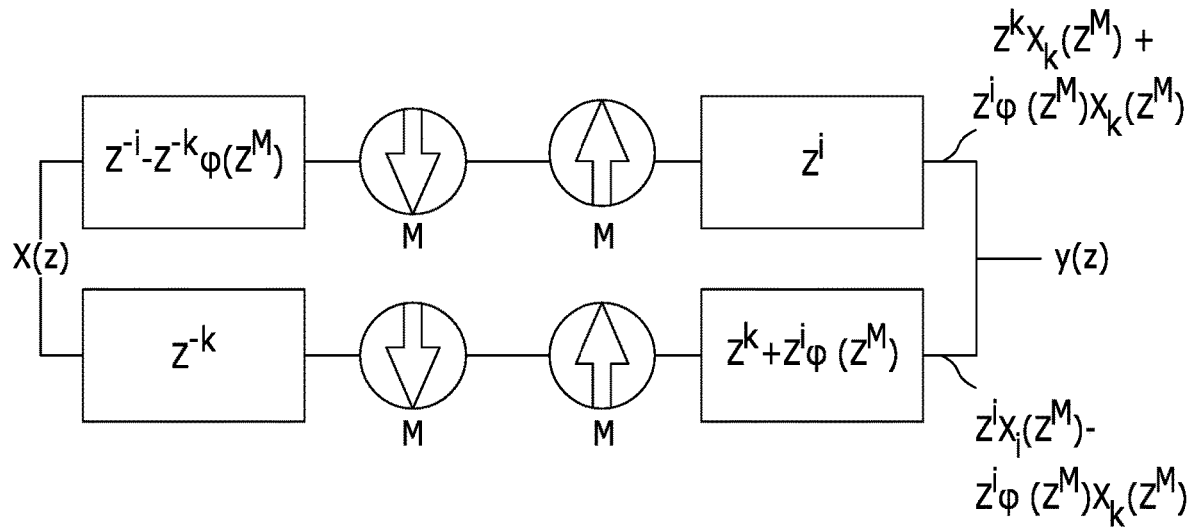
FIG. 4B shows the two arbitrary channels, i and k, shown in FIG. 4A, where channel is filter is altered at the sampling level and channel k's filter is altered at the reconstruction level.
Figure 7A:
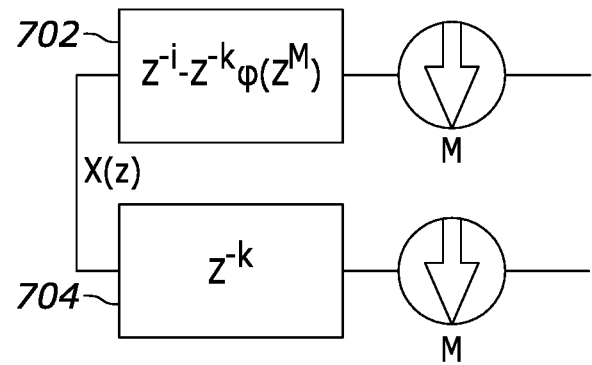
FIG. 7A illustrates filter coefficients operations for i and k samples of the input signal shown in FIG. 4B in accordance with an embodiment of the invention.
Figure 7B:
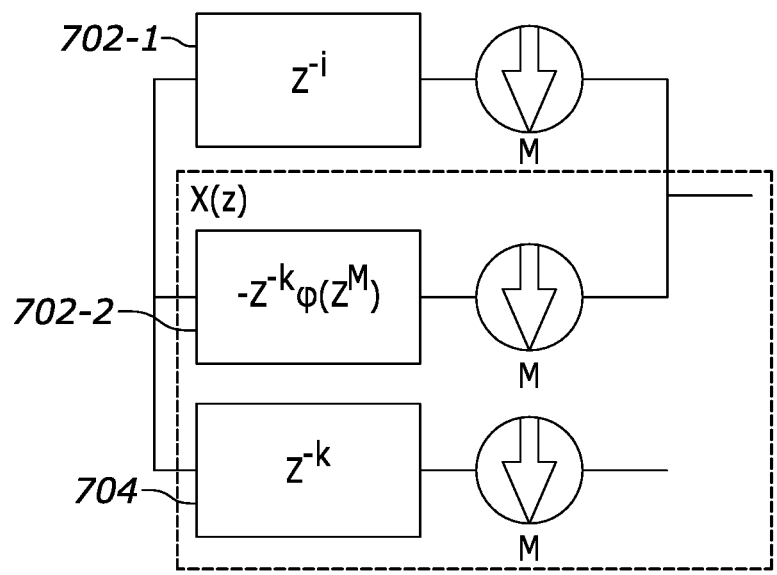
FIG. 7B illustrates simplified operations of the filter coefficients operations shown in FIG. 7A in accordance with an embodiment of the invention.

The filter coefficients operations 702 and 704, as shown in FIG. 7A, which are derived from FIG. 4B for i and k samples of the input signal, can be simplified into operations 702-1, 702-2 and 704 shown in FIG. 7B. Specifically, the operation 702 has been divided into the two operations 702-1 and 702-2. Thus, the operations 702 and 704 shown in FIG. 7A and the operations 702-1, 702-2 and 704 shown in FIG. 7B are effectively performing the same functions. By down-converting the coefficient multiplied filter signal before subtracting it from input delayed filter signal, operations at Nyquist frequencies are avoided, which is a novel way to design the input analog pre processing. The operations shown in FIG. 7B are performed by the input samplers of the AIC for an input signal.

Figure 8:
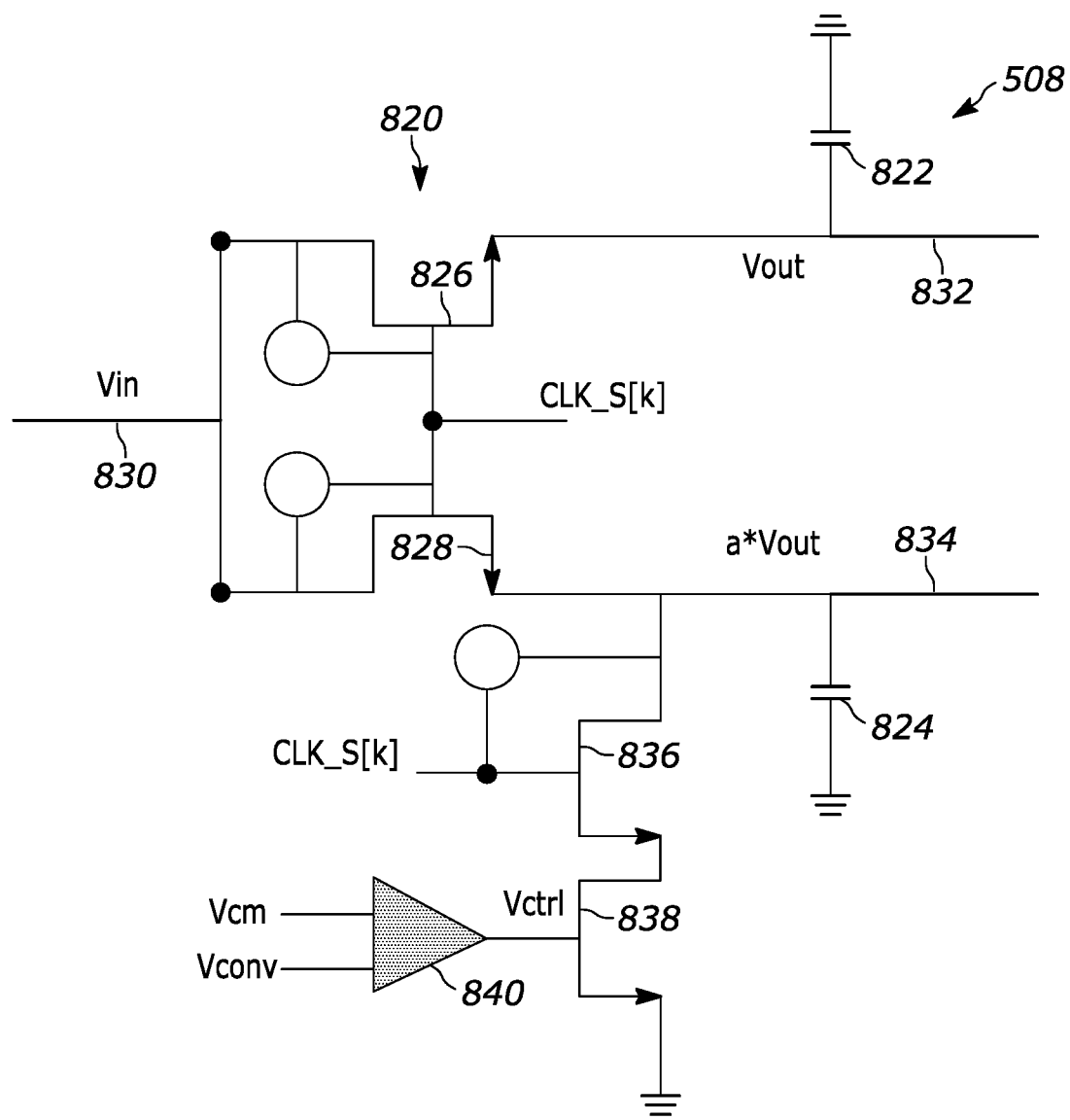
FIG. 8 is a diagram of a single input sampler of the AIC shown in FIG. 5 in accordance with an embodiment of the invention.

The input samplers 508 of the AIC 500 may be implemented using a network of bootstrap switches and sampling capacitors. A single input sampler 508 of the AIC 500 in accordance with an embodiment of the invention is shown in FIG. 8. The input sampler 508 includes a bootstrap switch 820 and capacitors 822 and 824. The bootstrapped switch 820 includes two switches 826 and 828 that are controlled by a clock signal CLK_S[k]. The switch 826 is connected to a Vin terminal 830 and a Vout terminal 832, which is connected to the capacitor 822 that is grounded. The output signal on the Vout terminal 832 represents the down-converted $Z^{-k}$. The switch 828 is connected to the Vin terminal 830 and an a*Vout terminal 834, which is connected to a capacitor 824 that is grounded. The output signal on the a*Vout terminal represents the down-converted $-Z^{-k}\varphi(Z^M)$, where $\varphi(Z^M)$ is a tunable attenuation factor "a" provided by series connected transistors 836 and 838, which create a resistive ladder effect on the attenuation factor "a". The transistor 866 is controlled by the clock signal CLK_S[k]. The transistor 838 is controlled by a control voltage Vctrl from an amplifier 840 that receives a common mode voltage Vcm and a convergence signal Vconv.

In operation, each input sample is held on the two capacitors of an input sampler, such as the capacitors 822 and 824, to achieve both $z^{-i}$ and $\varphi(z^M)$ filtered outputs as required in the MRSR algorithm. The controlled variation of the filter coefficient is represented by the tunable attenuation factor "a" that is generated by the resistive ladder formation of the bootstrap switches, such as the transistors 836 and 838, and is equal to $\varphi(z^M)$. Several of these attenuated blocks will form a complex filter function H(z). The gate-controlled (Vctrl) switch, e.g., the transistor 838, will change the attenuation factor "a" based on the resistive ladder effect from Vin to ground, and thereby, also changing the filter coefficient. If the coefficients are >1, the other sampling capacitors ($z^{-i}$) are also attenuated similarly to normalize the coefficient "a".

Turning back to FIG. 5, the AIC 500 further includes an analog M:N multiplexer 510, which is connected to the input samplers 508 to transmit N analog samples of an input multi-band signal from the possible M analog samples of the input multi-band signal to N analog-to-digital converters (ADCs) 512, which digitize the N analog samples of the input multi-band signal to N digital samples of the input multi-band signal. Thus, the parallel network 506 of samplers 508, the analog M:N multiplexer 510 and the ADCs 512 can be viewed as being the analog section 502 of the AIC 500.

The N outputs of the N ADCs 512 are transmitted to a digital N:M multiplexer 514, which is coupled to a processing unit 516, which is enabled to perform digital reconstruction of the input multi-band signal in digital form with the digital samples using the MRSR algorithm. Thus, the processing unit 516 performs the functions of the reconstruction filters 120 of the AIC architecture 100 shown in FIG. 1. The processing unit 516 is also able to control the filter coefficients of the samplers 508 and the reconstruction filters, which are implemented as software executed by the processing unit. Thus, the processing unit 516 controls the samplers 508 to disregard samples for frequency channels that are part of any signal bands of the input multi-band signals. In an embodiment, the processing unit 516 uses Cohen's class short time Fourier transform (STFT) to determine these unwanted frequency channels.

Figure 9:
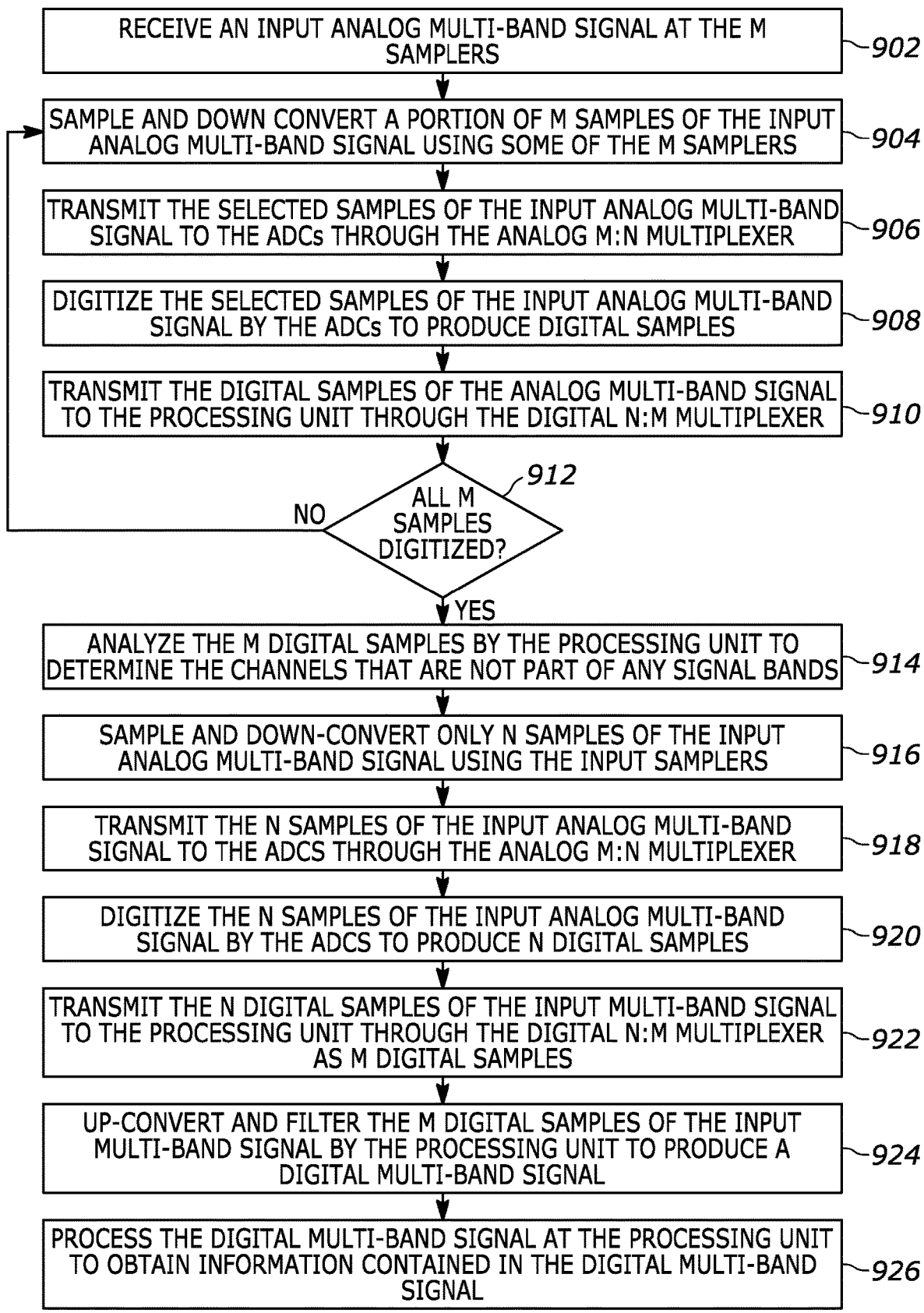
FIG. 9 is a flow diagram of the analog-to-information conversion process for multi-band signals performed by the AIC shown in FIG. 5 in accordance with an embodiment of the invention.

The analog-to-information conversion process for multi-band signals performed by the AIC 500 in accordance with an embodiment of the invention is described with reference to a flow diagram of FIG. 9. The analog-to-information conversion process begins at step 902, where an input analog multi-band signal is received at the M samplers of the AIC 500.

Next, at step 904, a portion of M samples of the input analog multi-band signal are sampled using some of the M samplers. This step of sampling the input analog multi-band signal is equivalent to filtering and down-converting selected samples of the input analog multi-band signal using some of the sampling filters 104 and the associated up-converters 108 in the AIC architecture 100. Next, at step 906, the selected samples of the input analog multi-band signal are sent to the ADCs 512 through the analog M:N multiplexer 510.

Next, at step 908, the selected samples of the input analog multi-band signal are digitized by the ADCs 512 to produce digital samples of the input analog multi-band signal. Next, at step 910, the digital samples of the input analog multi-band signal are transmitted to the processing unit 516 through the digital N:M multiplexer 514.

Next, at step 912, if all M samples of the all M samples of the input analog multi-band signal have digitized and transmitted to the processing unit 516, the process proceeds to step 914. If not, the process proceeds back to step 904 to sample and digitize the remaining samples of the input analog multi-band signal.

Next, at step 914, the M digital samples of the input analog multi-band signal are analyzed by the processing unit to determine the channels that are not part of any signal bands. In an embodiment, short time Fourier transform (STFT) is computed for the digital multi-band signal to find the channels that may not be part of any signal bands.

Next, at step 916, only N samples of the input analog multi-band signal are sampled and down-converted using the input samplers 508, where N is less than M. The samples that are not sampled correspond to the channels that have been determined to be not part of any signal bands, i.e., signals on these channels are not sampled. In an embodiment, this is achieved by the use of convergence signals to the samplers 508 from the processing unit 516, which changes the filter coefficients of the samplers 508.

Next, at step 918, the N samples of the input analog multi-band signal are sent to the ADCs 512 through the analog M:N multiplexer 510. Next, at step 920, the N samples of the input analog multi-band signal are digitized by the ADCs 512 to produce N digital samples of the input analog multi-band signal. Next, at step 922, the N digital samples of the input analog multi-band signal are transmitted to the processing unit 516 through the digital N:M multiplexer 514.

Next, at step 924, the M digital samples of the input multi-band signal are up-converted and filtered by the processing unit to produce a digital multi-band signal, which is a digitalized version of the input analog multi-band signal. Next, at step 926, the digital multi-band signal is processed at the processing unit 516 to obtain information contained in the digital multi-band signal. In addition, the filter coefficients of the samplers 508 and the reconstruction filters executed by the processing unit 516 are controlled by the processing unit, which results in samples for frequency channels that are part of any signal bands of the input multi-band signals being disregarded by the samplers.

In an embodiment, these steps may be repeated until convergence occurs with respect to H(z) and G(z) filtering being executed in the AIC. 500 As used herein, convergence means the state at which the H(z) and G(z) will stop changing and the system has reached a point where the new sampling rate ($N*F_0$) does not change anymore.

Figure 10:
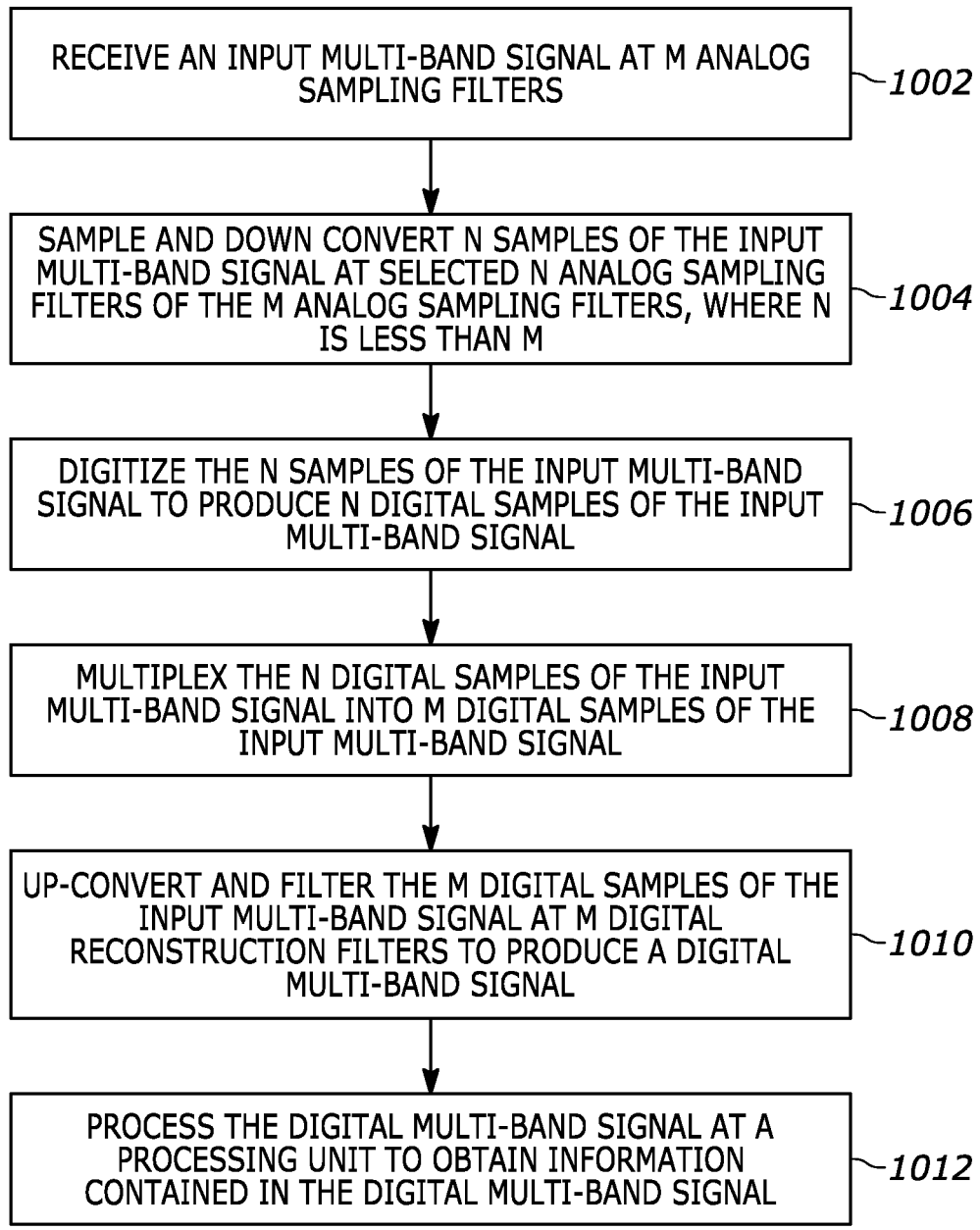
FIG. 10 is a process flow diagram of a method for performing analog-to-information conversion for multi-band signals in accordance with an embodiment of the invention.

A method for performing analog-to-information conversion for multi-band signals in accordance with an embodiment of the invention is described with reference to a process flow diagram of FIG. 10. At block 1002, an input multi-band signal is received at M analog sampling filters. At block 1004, N samples of the input multi-band signal are sampled and down-converted at selected N analog sampling filters of the M analog sampling filters, where N is less than M. At block 1006, the N samples of the input multi-band signal are digitized to produce N digital samples of the input multi-band signal. At block 1008, the N digital samples of the input multi-band signal are multiplexed into M digital samples of the input multi-band signal. At block 1010, the M digital samples of the input multi-band signal are up-converted and filtered at M digital reconstruction filters to produce a digital multi-band signal. At block 1012, the digital multi-band signal is processed at a processing unit to obtain information contained in the digital multi-band signal.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It can also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for performing analog-to-information conversion for multi-band signals, the method comprising:
    receiving an input multi-band signal at M analog sampling filters;
    sampling and down-converting N samples of the input multi-band signal at selected N analog sampling filters of the M analog sampling filters, where N is less than M;
    digitizing the N samples of the input multi-band signal to produce N digital samples of the input multi-band signal;
    multiplexing the N digital samples of the input multi-band signal into M digital samples of the input multi-band signal;
    up-converting and filtering the M digital samples of the input multi-band signal at M digital reconstruction filters to produce a digital multi-band signal; and
    processing the digital multi-band signal at a processing unit to obtain information contained in the digital multi-band signal.

2. The method of claim 1, further comprising analyzing the digital multi-band signal to determine frequency channels that are not part of any signal bands for the input multi-band signal and selectively excluding the frequency channels for sampling and down-converting N samples of the input multi-band signal.

3. The method of claim 2, wherein analyzing the digital multi-band signal includes using short time Fourier transform on the digital multi-band signal to determine the frequency channels that are not part of any signal bands for the input multi-band signal.

4. The method of claim 1, wherein sampling and down-converting the N samples of the input multi-band signal and up-converting and filtering the M digital samples of the input multi-band signal are part of a minimum rate sampling and reconstruction algorithm.

5. The method of claim 1, wherein each of the M analog sampling filters is configured to delay a particular sample and the M digital reconstruction filters are configured to remove the delay and synchronize the M digital samples to produce the digital multi-band signal.

6. The method of claim 1, wherein digitizing the N samples of the input multi-band signal includes digitizing the N samples of the input multi-band signal using less than M analog-to-digital converters.

7. The method of claim 1, wherein each of the M analog sampling filters includes a bootstrapped switch with a pair of capacitors to produce a delayed sample for a particular channel and an altering signal for a channel adjacent to the particular channel.

8. The method of claim 7, further comprising controlling the altering signal using a resistive ladder effect on an output terminal connected to one of the capacitors.

9. An analog-to-information converter for multi-band signals comprising:
    M analog sampling filters connected to an input terminal to receive an input multi-band signal, the M analog sampling filters being controlled to sample and down-convert N samples of the input multi-band signal at selected N analog sampling filters of the M analog sampling filters, where N is less than M;
    a plurality of analog-to-digital converters connected to the M analog sampling filters to digitize the N samples of the input multi-band signal to produce N digital samples of the input multi-band signal;
    a digital N:M multiplexer connected to the analog-to-digital converters to multiplex the N digital samples of the input multi-band signal into M digital samples of the input multi-band signal;
    M digital reconstruction filters connected to the digital N:M multiplexer to up-convert and filter the M digital samples of the input multi-band signal to produce a digital multi-band signal; and
    a processing unit coupled to the M digital reconstruction filters to process the digital multi-band signal to obtain information contained in the digital multi-band signal.

10. The analog-to-information converter of claim 9, wherein the processing unit is configured to analyze the digital multi-band signal to determine frequency channels that are not part of any signal bands for the input multi-band signal and selectively exclude the frequency channels to sample and down-convert the N samples of the input multi-band signal.

11. The analog-to-information converter of claim 10, wherein the processing unit is configured to use short time Fourier transform on the digital multi-band signal to determine the frequency channels that are not part of any signal bands for the input multi-band signal.

12. The analog-to-information converter of claim 9, wherein the M analog sampling filters and the M digital reconstruction filters operate to execute a minimum rate sampling and reconstruction algorithm.

13. The analog-to-information converter of claim 9, wherein each of the M analog sampling filters is configured to delay a particular sample and the M digital reconstruction filters are configured to remove the delay and synchronize the M digital samples to produce the digital multi-band signal.

14. The analog-to-information converter of claim 9, wherein the plurality of analog-to-digital converters includes less than M analog-to-digital converters.

15. The analog-to-information converter of claim 9, wherein each of the M analog sampling filters includes a bootstrapped switch with a pair of capacitors to produce a delayed sample for a particular channel and an altering signal for a channel adjacent to the particular channel.

16. The analog-to-information converter of claim 15, wherein the bootstrapped switch includes transistors connected in series to produce a resistive ladder effect on an output terminal connected to one of the capacitors to control the altering signal.

17. The analog-to-information converter of claim 9, wherein each of the M samplers is configured to delay a particular sample and the processing unit is configured to remove the delay and synchronize the M digital samples to produce the digital multi-band signal.

18. An analog-to-information converter for multi-band signals comprising:
M samplers connected to an input terminal to receive an input multi-band signal, the M samplers being controlled to sample and down-convert N samples of the input multi-band signal, where N is less than M;
a plurality of analog-to-digital converters connected to the M samplers to digitize the N samples of the input multi-band signal to produce N digital samples of the input multi-band signal;
a digital N:M multiplexer connected to the analog-to-digital converters to multiplex the N digital samples of the input multi-band signal into M digital samples of the input multi-band signal; and
a processing unit connected to the digital N:M multiplexer, the processing unit configured to up-convert and filter the M digital samples of the input multi-band signal to produce a digital multi-band signal and to process the digital multi-band signal to obtain information contained in the digital multi-band signal.

19. The analog-to-information converter of claim 18, wherein the processing unit is configured to analyze the digital multi-band signal to determine frequency channels that are not part of any signal bands for the input multi-band signal and selectively exclude the frequency channels to sample and down-convert the N samples of the input multi-band signal.

20. The analog-to-information converter of claim 18, wherein the M samplers and the processing unit operate to execute a minimum rate sampling and reconstruction algorithm.

* * * * *